(12) United States Patent
Wilson et al.

(10) Patent No.: US 7,375,662 B2
(45) Date of Patent: May 20, 2008

(54) METHOD OF AND SYSTEM FOR PERFORMING DIFFERENTIAL LOSSLESS COMPRESSION

(75) Inventors: Sophie Wilson, Cambridge (GB); John Redford, Cambridge (GB)

(73) Assignee: Broadcom Corporation, Irvine, CA (US)

( * ) Notice: Subject to any disclaimer, the term of this patent is extended or adjusted under 35 U.S.C. 154(b) by 721 days.

(21) Appl. No.: 10/725,008

(22) Filed: Dec. 2, 2003

(65) Prior Publication Data

US 2004/0170279 A1 Sep. 2, 2004

Related U.S. Application Data

(63) Continuation of application No. 10/232,728, filed on Sep. 3, 2002, now Pat. No. 6,720,894.

(60) Provisional application No. 60/383,618, filed on May 29, 2002.

(51) Int. Cl.
*H03M 7/00* (2006.01)

(52) U.S. Cl. .................................... 341/106; 341/50

(58) Field of Classification Search ................ 341/106, 341/51, 50, 107, 67
See application file for complete search history.

(56) References Cited

U.S. PATENT DOCUMENTS

| 4,914,508 A | 4/1990 | Music et al. |
| 6,720,894 B2 * | 4/2004 | Wilson et al. ............... 341/106 |

* cited by examiner

*Primary Examiner*—Jean Bruner Jeanglaude
*Assistant Examiner*—Joseph Lauture
(74) *Attorney, Agent, or Firm*—Sterne, Kessler, Goldstein & Fox PLLC

(57) ABSTRACT

A method of decompressing data words of an instruction set includes:
A. filling a primary dictionary with at least one primary data word of the instruction set, each of the at least one primary data word being stored in the primary dictionary in a location associated with a distinct primary dictionary index;
B. filling at least one secondary dictionary with at least one difference bit stream, each of the at least one difference bit stream being stored in one of the at least one secondary dictionary in a location associated with a distinct secondary dictionary index;
C. receiving a code word, the code word comprising:
 a. a header which identifies the primary dictionary and a specific one of the at least one secondary dictionary;
 b. a first bit stream; and
 c. a second bit stream;
 wherein the first bit stream comprises the distinct primary dictionary index and the second bit stream comprises the distinct secondary dictionary index;
D. retrieving the primary data word stored at the location in the primary dictionary location associated with the distinct primary dictionary index;
E. retrieving the difference bit stream stored at the location in the at least one secondary dictionary location associated with the distinct secondary dictionary index; and
F. performing a logic operation on the primary data word and the difference bit stream to obtain a resultant data word that is not stored in either the at least one primary dictionary or the at least one secondary dictionary.

20 Claims, 7 Drawing Sheets

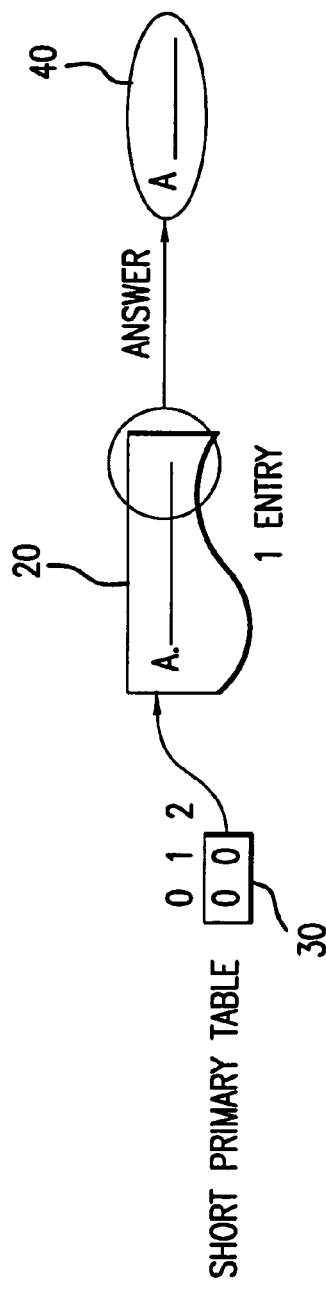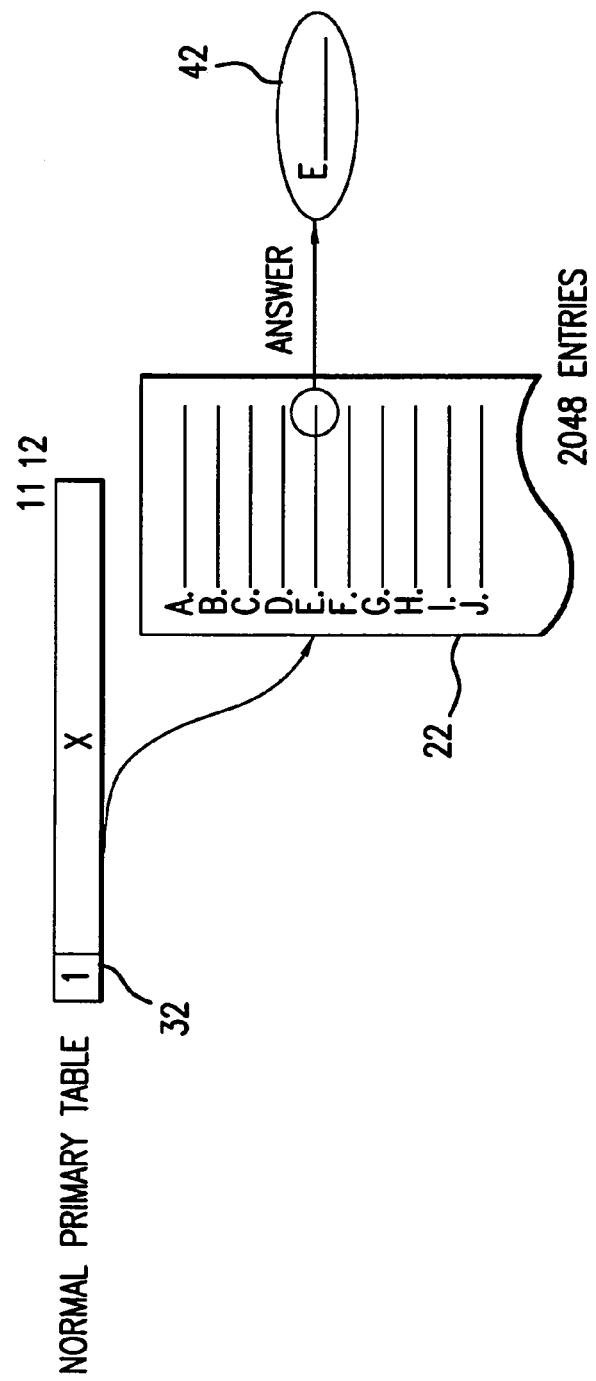

METHOD OF AND SYSTEM FOR PERFORMING DIFFERENTIAL LOSSLESS COMPRESSION

CROSS-REFERENCE TO RELATED APPLICATION

This application is a continuation of application Ser. No. 10/232,728, filed Sep. 3, 2002, now U.S. Pat. No. 6,720,894, which is a non-provisional application claiming priority to provisional application No. 60/383,618, filed May 29, 2002.

FIELD OF THE INVENTION

The present invention relates generally to a differential lossless compression method and system and more particularly to a method of and system for encoding instruction bit patterns using a primary dictionary for the most frequently occurring bit patterns and encoding the remaining instruction bit patterns using the differences between the remaining bit patterns and the bit patterns that are already encoded in the primary dictionary.

BACKGROUND OF THE INVENTION

In order to reduce the amount of memory needed to store data processing instructions in on-chip SRAM memory, the instructions are typically compressed to reduce the amount of memory that must be stored. Typical compression algorithms involve storing data words used in an instruction set in a look-up table and accessing the data words through the use of code words that identify the address at which the desired data word is stored. While this type of compression reduces the amount of memory needed compared to storing all of the necessary data words, it still requires a great amount of memory to operate properly.

SUMMARY OF THE INVENTION

The present invention provides a method of and system for performing lossless compression in which the most frequently accessed data words are stored in a primary dictionary and in which shortened code words are used to access these data words. Difference dictionaries are used to store difference bit streams which are accessed by code words which identify a data word in the primary dictionary and a difference bit stream in one of the difference dictionaries. An exclusive-OR operation is performed on the identified data word and the difference bit stream to calculate a decoded data word that is not stored in either the primary or difference dictionaries.

According to one aspect of the invention, a method of decompressing data words of an instruction set includes:
A. filling a primary dictionary with at least one primary data word of the instruction set, each of the at least one primary data word being stored in the primary dictionary in a location associated with a distinct primary dictionary index;
B. filling at least one secondary dictionary with at least one difference bit stream, each of the at least one difference bit stream being stored in one of the at least one secondary dictionary in a location associated with a distinct secondary dictionary index;
C. receiving a code word, the code word comprising:
  a. a header which identifies the primary dictionary and a specific one of the at least one secondary dictionary;
  b. a first bit stream; and
  c. a second bit stream;
  wherein the first bit stream comprises the distinct primary dictionary index and the second bit stream comprises the distinct secondary dictionary index;
D. retrieving the primary data word stored at the location in the primary dictionary location associated with the distinct primary dictionary index;
E. retrieving the difference bit stream stored at the location in the at least one secondary dictionary location associated with the distinct secondary dictionary index; and
F. performing a logic operation on the primary data word and the difference bit stream to obtain a resultant data word that is not stored in either the at least one primary dictionary or the at least one secondary dictionary.

The primary data words may include 32 bit words, the code words may include less than 32 bits, the first bit stream may include up to 11 bits and the second bit stream may include at least 5 bits. The logic operation may be an exclusive-OR operation. The at least one secondary dictionary may include a first secondary dictionary which includes difference bit streams which are more commonly included in the second bit stream of the code word and a second secondary dictionary which includes difference bit streams which are less commonly included in the second bit stream of the code word.

According to another aspect of the invention, a system for decompressing data words of an instruction set includes:
  a computer processor which performs operations based on the instruction sets;
  a memory device including:
    A. a primary dictionary including at least one primary data word of the instruction set, each of the at least one primary data word being stored in the primary dictionary in a location associated with a distinct primary dictionary index; and
    B. at least one secondary dictionary including at least one difference bit stream, each of the at least one difference bit stream being stored in one of the at least one secondary dictionary in a location associated with a distinct secondary dictionary index; and
  a decompression engine for receiving a code word from the computer processor and accessing the memory device to decode the code word to obtain a data word requested by the computer processor;
  wherein the code word includes:
    a. a header which identifies the primary dictionary and a specific one of the at least one secondary dictionary;
    b. a first bit stream; and
    c. a second bit stream;
    wherein the first bit stream comprises the distinct primary dictionary index and the second bit stream comprises the distinct secondary dictionary index; and
  wherein the decompression engine retrieves the primary data word stored at the location in the primary dictionary location associated with the distinct primary dictionary index;
  retrieves the difference bit stream stored at the location in the at least one secondary dictionary location associated with the distinct secondary dictionary index; and
  performs a logic operation on the primary data word and the difference bit stream to obtain a resultant data word that is not stored in either the at least one primary dictionary or the at least one secondary dictionary, the resultant data word being the data word requested by the computer processor.

According to another aspect of the invention, a system for decompressing data words of an instruction set includes:
a computer processor which performs operations based on the instruction sets;
a memory device including:
   A. a primary dictionary including at least one primary data word of the instruction set, each of the at least one primary data word being stored in the primary dictionary in a location associated with a distinct primary dictionary index; and
   B. a first secondary dictionary including at least one difference bit stream, each of the at least one difference bit stream being stored in the first secondary dictionary in a location associated with a distinct first secondary dictionary index; and
   C. a second secondary dictionary including at least one difference bit stream, each of the at least one difference bit stream being stored in the second secondary dictionary in a location associated with a distinct second secondary dictionary index; and
a decompression engine for receiving a code word from the computer processor and accessing the memory device to decode the code word to obtain a data word requested by the computer processor;
wherein the code word includes:
   a. a header which identifies the primary dictionary and one of the first secondary dictionary and the second secondary dictionary;
   b. a first bit stream; and
   c. a second bit stream;
   wherein the first bit stream comprises the distinct primary dictionary index and the second bit stream comprises the distinct secondary dictionary index for the secondary dictionary identified in the header; and
wherein the compression engine retrieves the primary data word stored at the location in the primary dictionary location associated with the distinct primary dictionary index, retrieves the difference bit stream stored at the location in the identified secondary dictionary location associated with the distinct secondary dictionary index; and
performs an exclusive-OR operation on the primary data word and the difference bit stream to obtain a resultant data word that is not stored in either the primary dictionary or the at least one secondary dictionary, the resultant data word being the data word requested by the computer processor.

According to yet another aspect of the invention, a system for decompressing data words of an instruction set includes:
processing means for performing operations based on the instruction sets;
a memory means including:
   A. a primary dictionary including at least one primary data word of the instruction set, each of the at least one primary data word being stored in the primary dictionary in a location associated with a distinct primary dictionary index; and
   B. a first secondary dictionary including at least one difference bit stream, each of the at least one difference bit stream being stored in the first secondary dictionary in a location associated with a distinct first secondary dictionary index; and
   C. a second secondary dictionary including at least one difference bit stream, each of the at least one difference bit stream being stored in the second secondary dictionary in a location associated with a distinct second secondary dictionary index; and
decompression means for receiving a code word from the computer processor and accessing the memory device to decode the code word to obtain a data word requested by the computer processor;
wherein the code word includes:
   a. a header which identifies the primary dictionary and one of the first secondary dictionary and the second secondary dictionary;
   b. a first bit stream; and
   c. a second bit stream;
   wherein the first bit stream comprises the distinct primary dictionary index and the second bit stream comprises the distinct secondary dictionary index for the secondary dictionary identified in the header; and
wherein the decompression means retrieves the primary data word stored at the location in the primary dictionary location associated with the distinct primary dictionary index, retrieves the difference bit stream stored at the location in the identified secondary dictionary location associated with the distinct secondary dictionary index; and
performs an exclusive-OR operation on the primary data word and the difference bit stream to obtain a resultant data word that is not stored in either the primary dictionary or the at least one secondary dictionary, the resultant data word being the data word requested by the computer processor.

BRIEF DESCRIPTION OF THE DRAWINGS

The foregoing and other objects of this invention, the various features thereof, as well as the invention itself may be more fully understood from the following description when read together with the accompanying drawings in which:

FIGS. 4A-4D are schematic diagrams showing the operation of the preferred compression algorithm;

DETAILED DESCRIPTION

Figure 1:
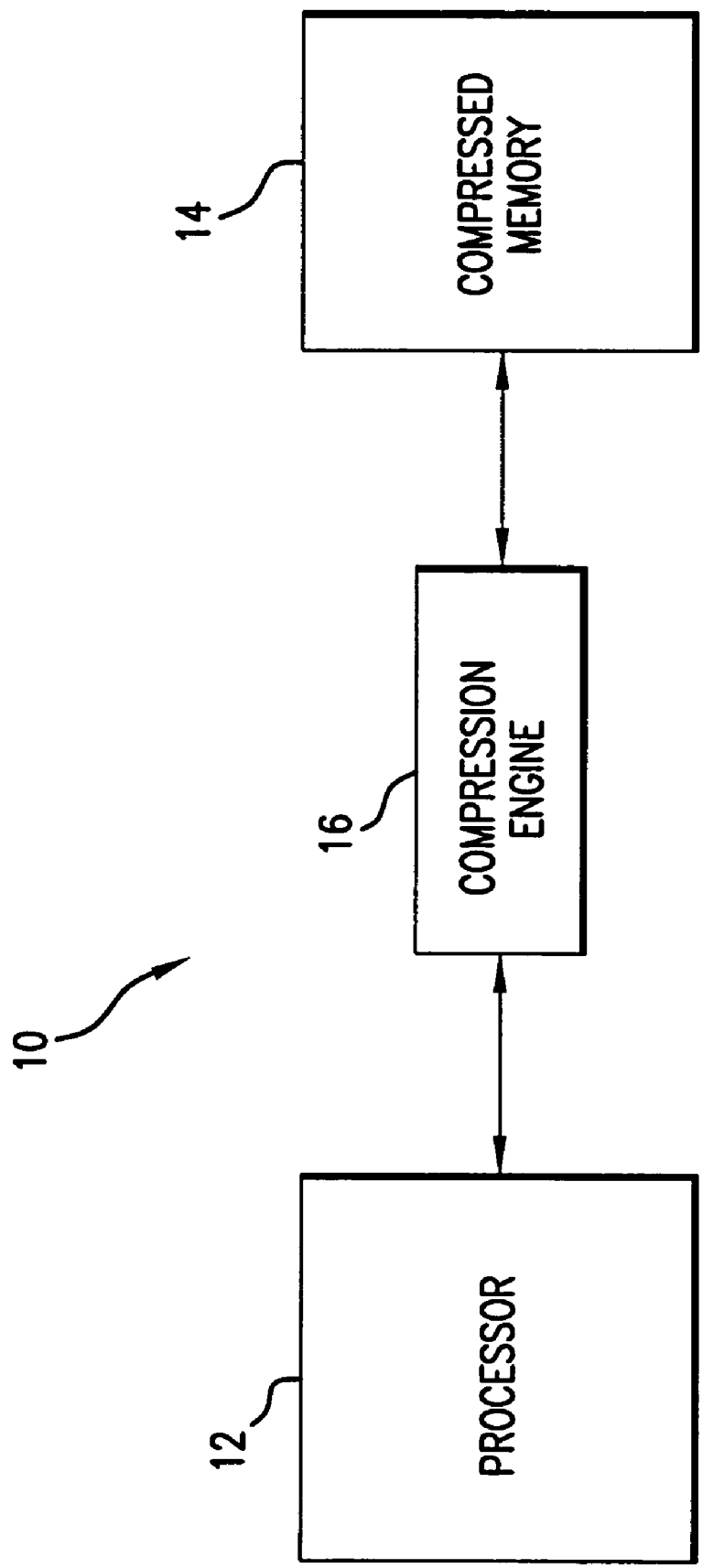
FIG. 1 is a schematic block diagram of a compression system according to a preferred embodiment of the present invention.

The present invention is directed to a method of and system for performing a lossless compression and decompression of 32 bit words of instruction sets. FIG. 1 is a schematic block diagram of a system 10 which includes a computer processor 12, an on-chip compressed memory device 14, such as an SRAM memory, and a compression engine 16. The 32 bit instruction set words are compressed in a manner described below, and stored in compressed memory device 14 for access by the processor 12. Compression engine 16 decompresses the instruction sets on memory requests from the processor 12 that represent instruction cache misses or data fetches. Therefore, in the preferred embodiment of the invention, the decompression of the instruction sets does not affect the instruction performance of the processor 12, since frequently executed instructions are accessed from the cache associated with the processor 12. Accordingly, in multiple-processor systems, a single compression engine 16 is used per memory device 14 to decompress instruction sets for each processor.

Figure 2:
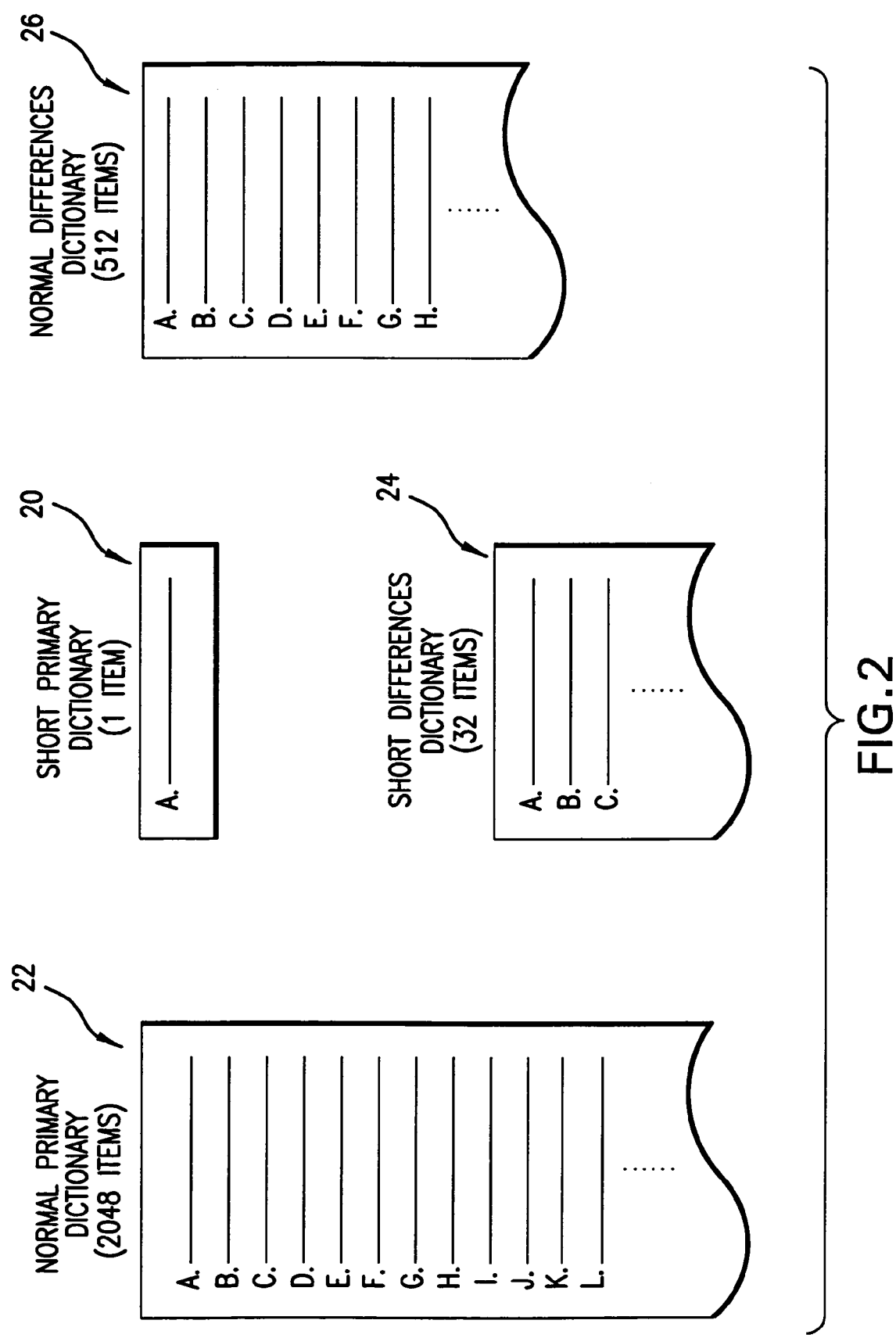
FIG. 2 is a schematic diagram of the dictionaries utilized in the memory device in accordance with the preferred embodiment of the present invention.

The preferred embodiment of the invention utilizes a compression algorithm in which the most frequently occurring 32 bit patterns of the instruction sets are stored in one of two primary dictionaries and less frequently used bit patterns are processed to determine a difference bit stream which, when compared to one of the bit patterns stored in the primary dictionary, result in the original bit pattern. The difference bit patterns are stored in one of two difference dictionaries. Specifically, the preferred embodiment includes four statically allocated dictionaries in which the bit streams required for enabling the compression algorithm to operate are stored. These dictionaries are shown schematically in FIG. 2. A short primary dictionary 20 includes the most popular 32 bit word accessed by the processor and a normal primary dictionary 22 includes the main body of 32 bit words that are frequently accessed by the processor. A short difference dictionary 24 and a normal difference dictionary 26 include difference bit streams which, as is described below, are used to calculate a 32 bit word that is not stored in either the short or normal primary dictionaries. In this context, the short difference dictionary 24 contains the difference bit streams that are most frequently accessed in order to calculate the 32 bit word, and the normal difference dictionary 26 contains the main body of difference bit streams that are accessed in order to calculate the 32 bit word. In this embodiment the short primary dictionary 20, normal primary dictionary 22, short difference dictionary 24 and normal difference dictionary 26 can contain 1, 2048, 32 and 512 independently addressable entries, respectively.

The preferred embodiment of the present invention utilizes three different categories of code words to access the dictionaries necessary to identify the 32 bit word that is to be accessed. The first type of code word is a direct reference to an address in either the short primary dictionary 20 or the normal primary dictionary 22. The second type of code word includes a direct reference to an address in the normal primary dictionary and a reference to an address in either the short difference dictionary 24 or the normal difference dictionary 26. As is described below, the difference bit stream located at the address referred to in the code word is compared to the 32 bit word located at the address referred in the code word to calculate the actual 32 bit word which will be utilized by the processor 12. The last type of code word is a directly coded 32 bit value, which results from a 32 bit word that cannot be compressed using the preferred algorithm. Accordingly, there are five types of code words that are utilized to determine which 32 bit word is being accessed by the processor. Each of the code words is identified by the header bits associated with each code word. The structure of each of these code words is schematically shown in FIG. 3, in which the bit index is shown across the top of the figure.

Figure 3:
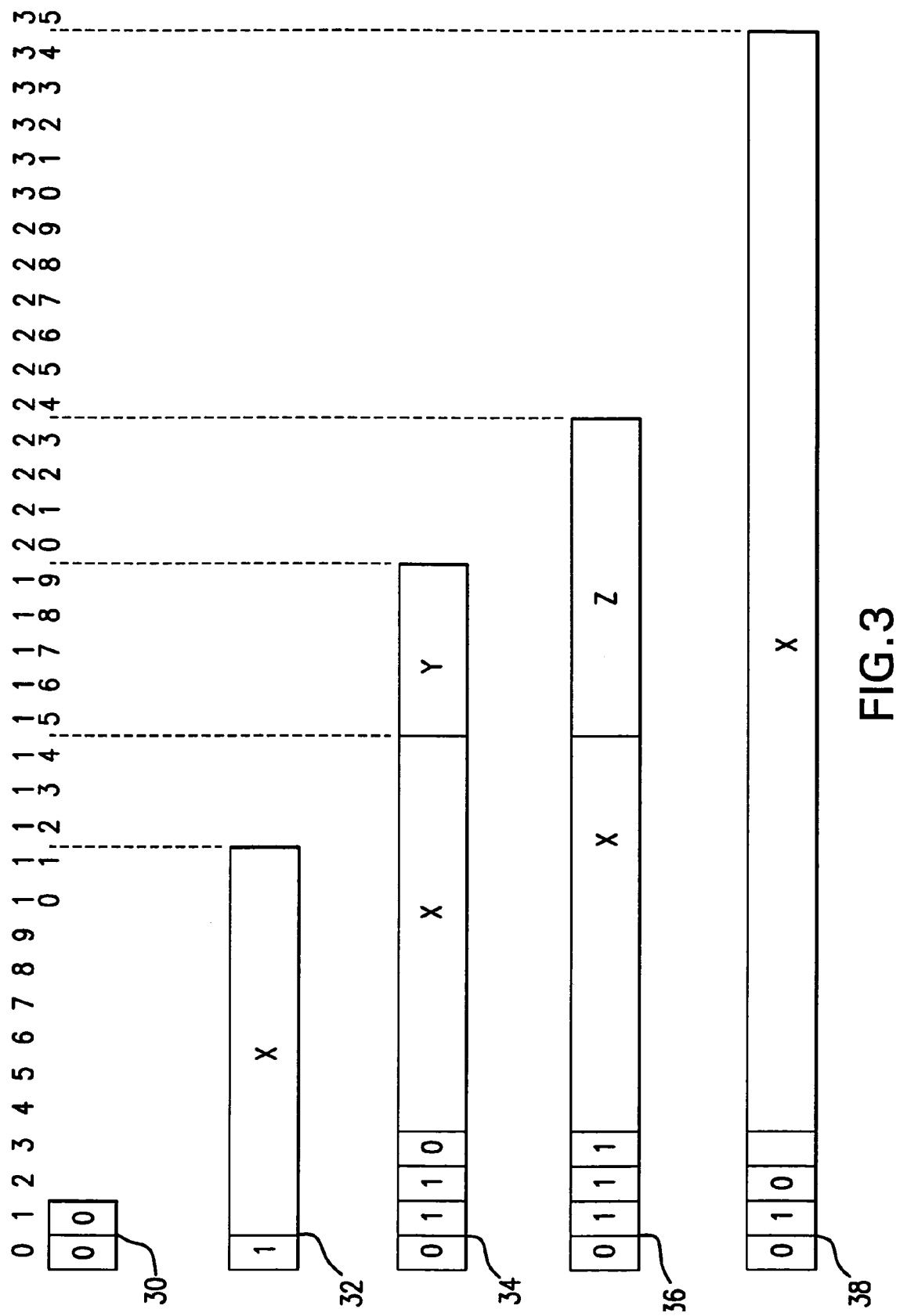
FIG. 3 is a schematic diagram of the code words utilized in the compression algorithm in accordance with the preferred embodiment of the present invention.

Shown in FIG. 3 is a code word 30 used to access the short primary dictionary 20, a code word 32 which is used to access the normal primary dictionary 22, a code word 34 which is used to access the normal primary dictionary 22 and the short difference dictionary 24, a code word 36 which is used to access the normal primary dictionary 22 and the normal difference dictionary 26 and a code word 38 which is a directly coded 32 bit word that cannot be compressed according to the present invention. As shown in the figure, each of the code words is identified by the header bits associated with the code word. Although any combination of bits may be used to identify each of the code words, in the preferred embodiment of the invention, the header "00" is used to identify the short primary dictionary code word 30 which has a length of 2 bits, the header "1" is used to identify the normal primary dictionary code word 32 which has a length of 12 bits, the header "0110" is used to identify the short difference code word 34 which has a length of 20 bits, the header "0111" is used to identify the normal difference code word 36 which has 24 bits, and the header "010" is used to identify a directly coded 32 bit word.

Based on the foregoing, the decoding algorithm can be written as follows:

| CASE header OF | |
|---|---|
| WHEN 00: | size:=2; result:=lookup_shortdictionary(0) |
| WHEN 1: | size:=12; result:=lookup_normaldictionary(bits 1-11) |
| WHEN 0110: | size:=20; result: =lookup_normaldictionary(bits 4-14) XOR lookup_shortdifferencedictionary(bits 15-19) |
| WHEN 0111: | size:=24; result:=lookup_normaldictionary(bits 1-11) XOR lookup_normaldifferencedictionary(bits 15-23) |
| WHEN 010: | size:=35; result:=bits 3-34 |

Accordingly, compression engine 16, upon receiving a particular code word to decode, first reads the header bits to determine in which dictionary the associated 32 bit word can be found. Since the short primary dictionary 20 only includes one item, only the two bits that make up the header "00" are needed to identify the 32 bit word stored in the short primary dictionary 20. Therefore, when compression engine 16 receives a code word having the header "00", the 32 bit word stored in the short primary dictionary 20 is output to the processor 12. This operation is schematically shown in FIG. 4A. The code word 30 is received by compression engine 16, which identifies the code word as a reference to the entry in the short primary dictionary 20 based on the header "00". Compression engine 16 then fetches the 32 bit word 40 stored at address A in the short primary dictionary 20 and forwards it to the processor 12.

Code word 32 includes the header bit "1" and an 11 bit stream X (bits 1-11) which identifies the address at which a particular 32 bit word is stored in the normal primary dictionary 22. This 11 bit length of bit stream X enables a total of 2048 addresses at which 32 bit words may be stored in the normal primary dictionary 22. Therefore, when compression engine 16 receives a code word having the header "1", it recognizes the code word as a normal primary dictionary code word in which the 11 bits that follow the header identify an address in the normal primary dictionary 22 at which the 32 bit word required by the processor 12 is stored. This operation is schematically shown in FIG. 4B. The code word 32 is received by compression engine 16, which identifies the code word as a reference to the entry in the normal primary dictionary 22 based on the header "1". Compression engine 16 then fetches the 32 bit word 42 stored in the normal primary dictionary 22 at the address E indicated by 11 bit stream X and forwards it to the processor 12.

Figure 4C:
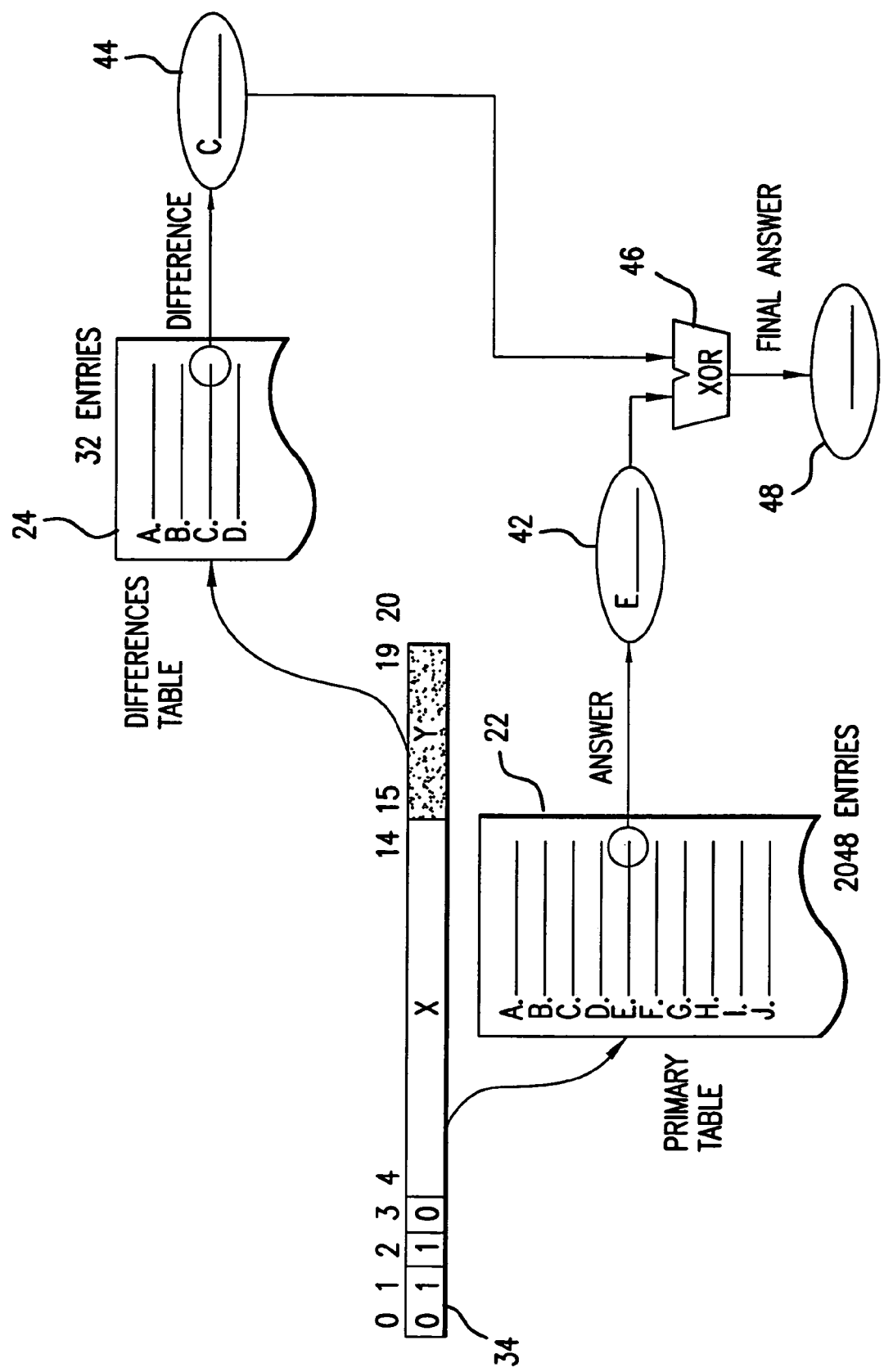

Code word 34 includes the 4 bit header "0110", an 11 bit stream X(bits 4-14) and a 5 bit stream Y(bits 15-19). Similar to the code word 32, the 11 bit stream X in code word 34 identifies an address in the normal primary dictionary 22 at which a particular 32 bit word is stored. However, the 5 bit stream Y identifies an address in the short difference dictionary 24 at which a difference bit stream is stored that will enable the compression engine 16 to calculate the 32 bit word that the processor 12 has requested. The 5 bit length of bit stream Y enables a total of 32 addresses at which 32 bit words may be stored in short difference dictionary 24. In the preferred embodiment, the compression engine calculates the requested 32 bit word by performing an exclusive-OR (XOR) function on the 32 bit word located at the address in normal primary dictionary 22 indicated by the 11 bit stream X and the 32 bit word located at the address in the short difference dictionary 24 indicated by the 5 bit stream Y. The resulting 32 bit word is the word that has been requested by the processor 12. This operation is schematically shown in FIG. 4C . The code word 34 is received by compression engine 16, which identifies the code word as a 20 bit reference to the entry in the normal primary dictionary 22 and to the short difference dictionary 24 based on the header "0110". Compression engine 16 then fetches the 32 bit word 42 stored in the normal primary dictionary 22 at the address E indicated by 11 bit stream X and the 32 bit word 44 stored in the short difference dictionary 24 at the address C indicated by 5 bit stream Y. Compression engine 16 then performs an XOR function 46 on the words 42 and 44 to calculate the 32 bit word 48, which is then forwarded to the processor 12.

Figure 4D:
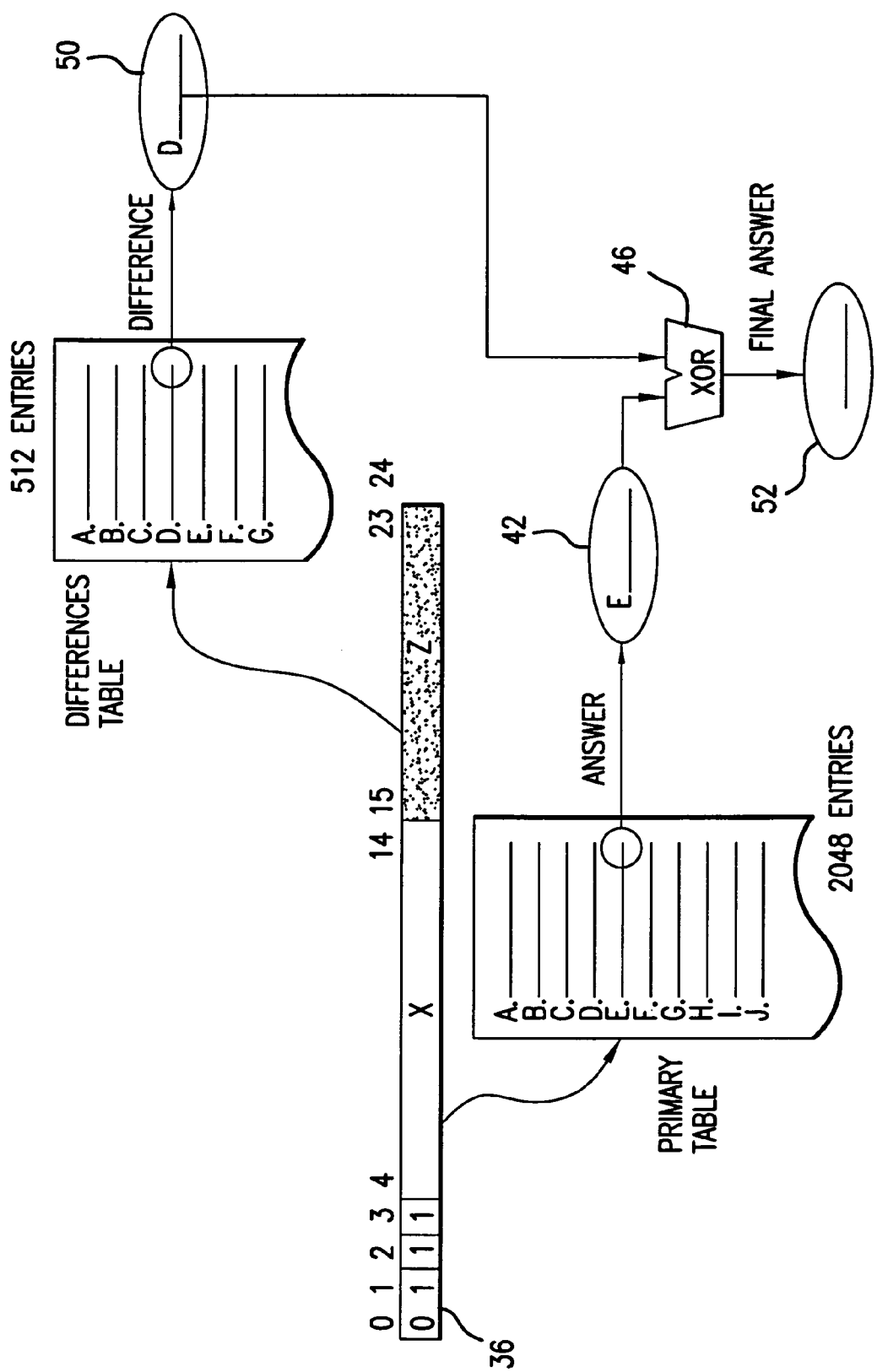

Code word 36 includes the 4 bit header "0111", an 11 bit stream X(bits 4-14) and a 9 bit stream Z (bits 15-23). Similar to the code word 32, the 11 bit stream X in code word 34 identifies an address in the normal primary dictionary 22 at which a particular 32 bit word is stored. The 9 bit stream Z identifies an address in the normal difference dictionary 26 at which a difference bit stream is stored that will enable the compression engine 16 to calculate the 32 bit word that the processor 12 has requested. The 9 bit length of bit stream Z enables a total of 512 addresses at which 32 bit words may be stored in normal difference dictionary 26. In the preferred embodiment, the compression engine calculates the requested 32 bit word by performing an exclusive-OR (XOR) function on the 32 bit word located at the address in normal primary dictionary 22 indicated by the 11 bit stream X and the 32 bit word located at the address in the normal difference dictionary 26 indicated by the 9 bit stream Z. The resulting 32 bit word is the word that has been requested by the processor 12. This operation is schematically shown in FIG. 4D. The code word 36 is received by compression engine 16, which identifies the code word as a 24 bit reference to the entry in the normal primary dictionary 22 and to the normal difference dictionary 26 based on the header "0111". Compression engine 16 then fetches the 32 bit word 42 stored in the normal primary dictionary 22 at the address E indicated by 11 bit stream X and the 32 bit word 50 stored in the normal difference dictionary 26 at the address D indicated by 9 bit stream Z. Compression engine 16 then performs an XOR function 46 on the words 42 and 50 to calculate the 32 bit word 52, which is then forwarded to the processor 12.

An example of the decompression of a code word 36 is as follows. A code word received by compression engine 16 is:
0111 00101111011 100101100
(Spaces have been inserted between the different portions of the code word to simplify the description of the example.) Upon receiving the code word, compression engine 16 determines, based on the header "0111", that what follows is an 11 bit address of an entry in the normal primary dictionary 22 followed by a 9 bit address of an entry in the normal difference dictionary 26. Accordingly, compression engine accesses address 00101111011 in normal primary dictionary 22 and retrieves the 32 bit word 42:
00011110111001000010011110011101.
Compression engine 16 then accesses address 100101100 in normal difference dictionary 26 and retrieves the 32 bit word 50:
10000011000111100111000000100100.
The XOR function 46 is then performed on words 42 and 50:

00011110111001000010011110011101 (word 42)
XOR 10000011000111100111000000100100 (word 50)
10011101111110100101011110111001 (word 52)

The result of the XOR operation, word 52, is then forwarded to the processor 12.

Based on this compression algorithm, it can be seen that the following compression ratios can be realized:

| Code Word Type | Length (Bits) | Compression Ratio (Compared to 32 Bit Word) |
|---|---|---|
| Short Primary Dictionary | 2 | 93.75% |
| Normal Primary Dictionary | 12 | 62.5% |
| Short Difference Dictionary | 20 | 37.5% |
| Normal Difference Dictionary | 24 | 25% |

Figure 5:
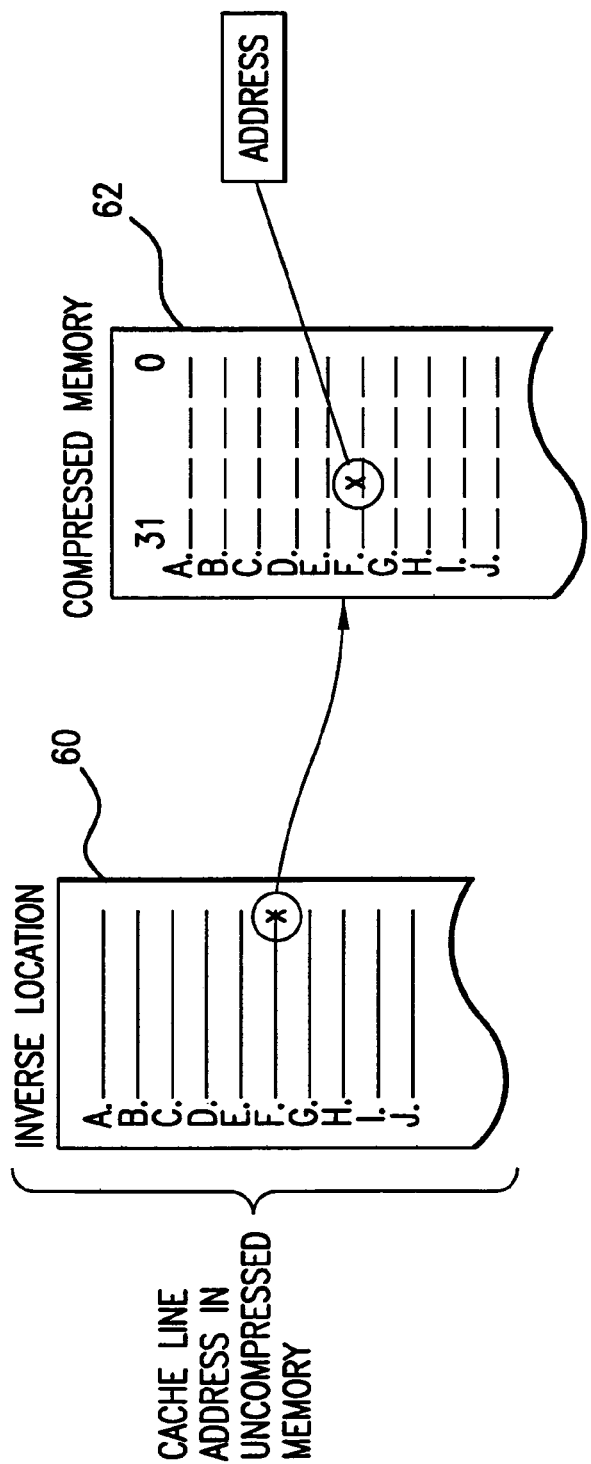
FIG. 5 is a schematic diagram of further lookup tables in accordance with the preferred embodiment of the present invention.

The above describes the decompression of single code words which represent 32 bit words. In typical operation, however, the compression engine 16 decompresses cache lines that include several 32 bit words. This decompression involves the decoding of each single word after determining where in the compressed data the first code word for the cache line resides. Determining where the first code word in a cache line resides is done using an inverse location table, such as is shown at 60 in FIG. 5. Inverse location table 60 contains, for each cache line number, which is the address of the cache line divided by the size of the cache line, the bit number of the first compressed code word for that cache line. The information in inverse location table 60 can also be compressed by dividing the table into segments, as shown at 62 in FIG. 5, in which the table is divided into quarters. Accordingly, the compressed data referred to by each quarter of the table must be in the respective quarter of the memory. In order to reduce the drain of the inverse location table on the efficiency of the compression algorithm, cache lines can be made larger. For example, if the size of a cache line is doubled, the size of the inverse location table would be cut in half.

As set forth above, the short primary dictionary 20 contains the most frequently accessed data word and the normal primary dictionary 22 contains data words that are more frequently accessed by the processor 12. Ideally, the short difference dictionary 24 and the normal difference dictionary 26 are filled with difference bit streams that enable a maximum number of data words to be encoded. In the present embodiment, the differences that will be used to decode the code words are calculated against the primary dictionaries using a weighting scheme that forces a clustering of the differences, which enables a best difference to be determined for each data word that cannot be encoded. The most popular of these "best" differences are inserted into the difference dictionaries.

Figure 6:
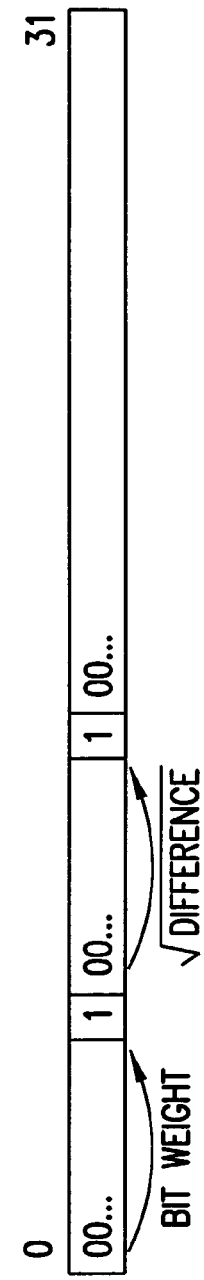
FIG. 6 is a schematic diagram showing the parameters involved in the weighting function in accordance with the preferred embodiment of the present invention.

The preferred weighting scheme involves searching for difference bit streams that have the minimum number of bits required for converting the data words stored in the primary dictionaries to the desired decoded data word. Typically, the number of bits required to convert data words in the primary dictionaries is approximately 1 to 10 bits. This is because the weighting of the minimum number of bits causes the lower number of bits to be selected more often. Once the minimum number of bits have been found, further clustering of the many possible difference bit streams is attained by weighting the bits and the distance between adjacent bits. The preferred weighting function involves, for each set bit in the difference, adding the weight or index of the bit to the square root of the distance between the bit and the preceding set bit, which is the difference of the indexes, multiplied by 32. The parameters of this weighting function are shown schematically in FIG. 6. Once the primary and difference dictionaries are filled, the compression device 16 is able to encode each data word of the instruction set, while building the inverse location table 60, as described above.

Accordingly, the present invention provides a method of and system for performing lossless compression in which the most frequently accessed data words are stored in a primary dictionary and in which shortened code words are used to access these data words. Difference dictionaries are used to store difference bit streams which are accessed by code words which identify a data word in the primary dictionary and a difference bit stream in one of the difference dictionaries. An exclusive-OR operation is performed on the identified data word and the difference bit stream to calculate a decoded data word that is not stored in either the primary or difference dictionaries.

The invention may be embodied in other specific forms without departing from the spirit or essential characteristics thereof. For example, although an exclusive-OR operation is performed to decode the data words in the preferred embodiment, it will be understood that any logic operation may be used to manipulate the stored data words to obtain data words that are not stored in the dictionaries. Furthermore, the arrangement of dictionaries and the bit lengths of the various bit streams may be different in order to accommodate the storage of greater or lesser data words and difference bit streams in the dictionaries. The specifically disclosed code word format is not intended to be limiting and therefore alternative, functionally equivalent, formats may be employed. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

The invention claimed is:

1. A method of providing a decompressed data word to a processor comprising:
   receiving a code word;
   identifying one or more dictionaries and one or more addresses based upon the code word;
   retrieving one or more particular words from the one or more dictionaries based upon the one or more addresses;
   calculating the decompressed data word from the one or more particular words; and
   forwarding the decompressed data word to the processor for further processing.

2. The method of claim 1, wherein the step of identifying one or more dictionaries and one or more addresses comprises:
   identifying one or more dictionaries based upon a header of the code word; and
   identifying one or more addresses for one or more particular words based upon one or more bit streams.

3. The method of claim 2, wherein the step of identifying the one or more dictionaries based upon the header of the code word comprises:
   identifying a short primary dictionary when the header corresponds to a first value;
   identifying a normal primary dictionary when the header corresponds to a second value;
   identifying a normal primary dictionary and a short difference dictionary when the header corresponds to a third value; and
   identifying a normal primary dictionary and a normal difference dictionary when the header corresponds to a fourth value.

4. The method of claim 2, wherein the step of identifying one or more addresses for one or more particular words further comprises:
   identifying a first address for a first particular word based upon a first bit stream; and
   identifying a second address for a second particular word based upon a second bit stream.

5. The method of claim 4, wherein the step of retrieving the one or more particular words from the one or more dictionaries further comprises:
   retrieving the first particular word from the normal primary dictionary based upon the first address; and
   retrieving the second particular word from the short difference dictionary based upon the second address.

6. The method of claim 5, wherein the step of calculating the decompressed data word from the one or more particular words comprises:
   calculating the decompressed data word from the first particular word and the second particular word.

7. The method of claim 4, wherein the step of retrieving the one or more particular words from the one or more dictionaries further comprises:
   retrieving the first particular word from the normal primary dictionary based upon the first address; and
   retrieving the second particular word from the normal difference dictionary based upon the second address.

8. The method of claim 7, wherein the step of calculating the decompressed data word from the one or more particular words comprises:
   calculating the decompressed data word from the first particular word and the second particular word.

9. The method of claim 1, wherein the step of calculating the decompressed data word from the one or more particular words comprises:
   performing a logical operation on the one or more particular words to produce the decompressed data word.

10. The method of claim 9, wherein the step of performing the logical operation on the one or more particular words comprises:
    performing an exclusive-OR function on the one or more particular words to produce the decompressed data word.

11. A computer system, comprising:
    a processor configured to perform operations based on an instruction set;

a memory device including one or more dictionaries; and a decompression engine, wherein the decompression engine:
receives a code word, wherein the code word includes a header and one or more bit streams,
identifies one or more addresses of the memory device for one or more particular words based upon the one or more bit streams,
retrieves one or more particular words from the memory device based upon the one or more addresses,
calculates a decompressed data word from the one or more particular words, and
forwards the decompressed data word to the processor for further processing.

12. The system of claim 11, wherein the one or more dictionaries includes at least one of:
a short primary dictionary,
a normal primary dictionary,
a short difference dictionary, and
a normal difference dictionary.

13. The system of claim 11, wherein the decompression engine accesses a short primary dictionary when the header corresponds to a first value, accesses a normal primary dictionary when the header corresponds to a second value, accesses the normal primary dictionary and a short difference dictionary when the header corresponds to a third value, and accesses the normal primary dictionary and a normal difference dictionary when the header corresponds to a fourth value.

14. The system of claim 13, wherein the decompression engine identifies a first address for a first particular word based upon a first bit stream and identifies a second addresses for a second particular word based upon a second bit stream.

15. The system of claim 14, wherein the decompression engine retrieves the first particular word from the normal primary dictionary based upon the first address and retrieves the second particular word from the short difference dictionary based upon the second address.

16. The system of claim 15, wherein the decompression engine calculates the decompressed data word from the first particular word and the second particular word.

17. The system of claim 14, wherein the decompression engine retrieves the first particular word from the normal primary dictionary based upon the first address and retrieves the second particular word from the normal difference dictionary based upon the second address.

18. The system of claim 17, wherein the decompression engine calculates the decompressed data word from the first particular word and the second particular word.

19. The system of claim 11, wherein the decompression engine performs a logical operation on the one or more particular words to produce the decompressed data word.

20. The system of claim 19, wherein the logical operation includes an exclusive-OR function.

* * * * *

UNITED STATES PATENT AND TRADEMARK OFFICE
CERTIFICATE OF CORRECTION

PATENT NO. : 7,375,662 B2 Page 1 of 1
APPLICATION NO. : 10/725008
DATED : May 20, 2008
INVENTOR(S) : Wilson et al.

It is certified that error appears in the above-identified patent and that said Letters Patent is hereby corrected as shown below:

<u>Column 12</u>

Line 4, please replace "addresses" with --address--.

Signed and Sealed this

Fourth Day of November, 2008

JON W. DUDAS
*Director of the United States Patent and Trademark Office*